United States Patent
Yang et al.

(10) Patent No.: US 6,465,360 B2
(45) Date of Patent: *Oct. 15, 2002

(54) METHOD FOR FABRICATING AN ULTRA SMALL OPENING

(75) Inventors: Jin-Sheng Yang, Hsinchu; Tzung-Han Lee, Taipei; Kun-Chi Lin, Hsinchu, all of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/532,282

(22) Filed: Mar. 23, 2000

(65) Prior Publication Data

US 2002/0094693 A1 Jul. 18, 2002

(30) Foreign Application Priority Data

Feb. 16, 2000 (TW) ........................................ 89102589 A

(51) Int. Cl.⁷ ............................................. H01L 21/302
(52) U.S. Cl. ........................ 438/706; 438/710; 438/712; 438/713
(58) Field of Search ................................. 438/706, 710, 438/712, 713, 637, 638, 639; 430/313, 325

(56) References Cited

U.S. PATENT DOCUMENTS

| 5,468,595 A | * | 11/1995 | Liversay ...................... 430/296 |
| 5,635,337 A | * | 6/1997 | Bartha et al. ................ 430/323 |
| 5,714,037 A | * | 2/1998 | Puntambekar et al. ...... 156/345 |
| 5,858,620 A | * | 1/1999 | Ishibashi et al. ............ 430/313 |
| 5,863,707 A | * | 1/1999 | Lin ............................. 430/313 |
| 5,877,076 A | * | 3/1999 | Dai ............................ 438/597 |
| 6,162,591 A | * | 12/2000 | Gao et al. .................... 430/325 |

* cited by examiner

*Primary Examiner*—Benjamin L. Utech
*Assistant Examiner*—Lan Vinh
(74) *Attorney, Agent, or Firm*—J.C. Patents

(57) ABSTRACT

A fabrication method for an ultra-small opening is described, wherein a first photoresist layer is formed on a substrate. Exposure and development processes are further conducted to transfer the desired pattern with a small opening from the mask layer onto the surface of the first photoresist layer. A plasma treatment is then conducted on the first photoresist layer, followed by coating a second photoresist layer on the first photoresist layer.

27 Claims, 3 Drawing Sheets

METHOD FOR FABRICATING AN ULTRA SMALL OPENING

CROSS-REFERENCE TO RELATED APPLICATION

This application claims the priority benefit of Taiwan application serial no. 89102589, filed Feb. 16, 2000.

BACKGROUND OF THE INVENTION

1. Field of the Invention

The present invention relates to a method for fabricating a semiconductor device. More particularly, the present invention relates to a method for fabricating an opening with small critical dimension.

2. Description of the Related Art

In the fabrication of semiconductor devices, increasing device density on a given die area provides significant advantages such as speed and power efficiency. Openings, such as vias and contacts with sizes as small as about 0.15 to 0.2 micron, are frequently formed by photolithographic patterning of the insulating layer. FIGS. 1A to 1C illustrate the forming of a via or contact opening using photolithography technique according to the conventional practice.

As shown in FIG. 1A, a wafer substrate 100 with a layer of insulation material 102 is provided. A photoresist layer 104, for example, a negative photoresist, is coated on the surface of the insulation material 102.

Referring to FIG. 1B, a mask layer 106 is precisely aligned and disposed over the substrate 100. Thereafter, the photoresist layer 104 is exposed to light or other radiation sources through the mask layer 106 and then is developed.

Continuing to FIG. 1C, the exposed portion of the insulation material 102 and the photoresist layer 104 are removed, forming a via or contact opening 108 in the insulation material 102.

The photolithography technique can produce very fine resolution on a substrate; however, as the dimensions of a semiconductor device are gradually reduced, the control of the critical dimension in a photolithography process is hindered by the limitations of light resolution and the depth of focus (DOF). Due to the manufacturing constraints associated with the technologies capable of producing extremely high resolution, the development of dies having greater device density and smaller device features is seriously hampered.

Presently, deep-UV wavelengths are used for fine-resolution photolithography. Switching to a higher frequency would theoretically allow a greater density and smaller device features, but it would not be very cost effective due to the need to develop new equipments, fabrication techniques, or photoresists appropriates for the shorter wavelengths.

Other approaches to reduce the critical dimension of a device usually requires the employment of a more complicated mask, for example, PSM, and to conduct a special exposure technique, for example, an off-axial illumination. The purpose of reducing the critical dimension can be achieved with the above approaches, the manufacturing cost of an integrated circuit, however, is also increased significantly. Furthermore, adjacent areas of the constructive interference are often seen as a single large region, and are not resolved in some cases.

The E-beam exposure systems and the X-Ray systems are two other options for forming openings with a width of about 0.1 micron or less. Unfortunately, the E-beam and the X-ray systems are still in the research stage. Furthermore, using the E-beam and the X-ray systems are also not very cost effective.

SUMMARY OF THE INVENTION

Based on the foregoing, the present invention provides a fabrication method for an ultra-small opening, for example, sub-0.1 micron, using the existing and less expensive technology.

As embodied and broadly described herein, the present invention provides a method for producing an opening with small critical dimension, for example, sub-0.1 micron, wherein a first photoresist layer is coated on a semiconductor substrate. A mask layer with a small opening pattern is then accurately aligned with the substrate. After this, the first photoresist layer is exposed to light through the mask layer and is then developed. After removing the unpolymerized portion on the first photoresist layer, an opening is formed in the first photoresist layer. A plasma treatment process is then conducted on the surface of the remaining first photoresist layer, forming free radicals and bridging bonds on the surface of the first photoresist layer. A thin layer of a second photoresist is further conformally coated on the active surface of the first photoresist layer, resulting with an ultra-small opening.

Accordingly, the present invention uses well established processes to provide an opening smaller in size, for example, sub-0.1 micron. By performing this surface treatment process on the photoreist layer, an ultra-small opening can be formed without the use of a light source with a shorter wavelength. Furthermore, cheaper methods employing a light source with longer wavelengths can be used without the loss of resolution. The present invention thereby increases the performance of the products by scaling the existing technology in a controllable fashion.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

A method of forming an ultra-small opening using the existing and less expensive techniques is described.

Figure 1A:
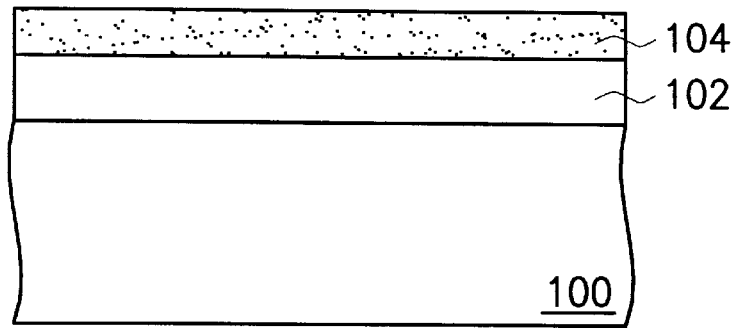
FIGS. 1A to 1C are schematic, cross-sectional views showing the manufacturing of a small opening according to the prior art.
Figure 1B:
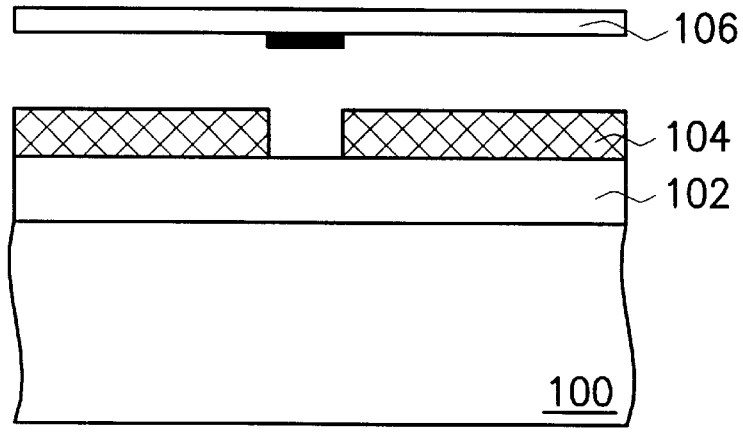
Figure 1C:
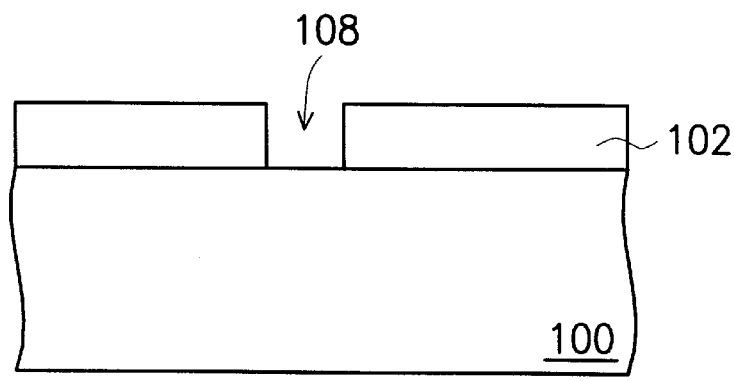
Figure 2A:
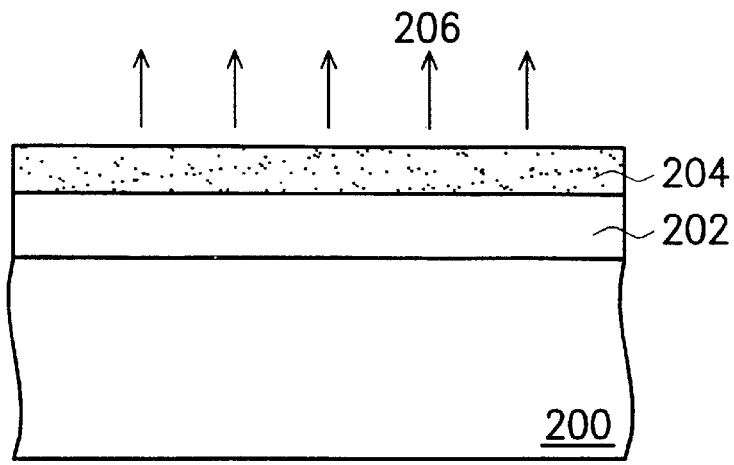
FIGS. 2A to 2F are schematic, cross-sectional views showing the manufacturing of an ultra-small opening according to the preferred embodiment of the present invention.

Referring to FIG. 2A, a semiconductor substrate 200 with a material layer 202 formed thereon is provided. The substrate 200 may also be one of the layers in a multilevel interconnect, and the material layer 202 is an insulation layer. The material layer 202, for example, silicon oxide, can be deposited using standard chemical vapor deposition (CVD) method or other applicable techniques. The thickness of the material layer 202 determines the depth of the opening formed in the material layer 202 subsequently.

Still referring to FIG. 2A, a photosensitive film, for example, a photoresist layer (PR) 204, is spin coated on the surface of the material layer 202. The photoresist layer 204 can either be a positive photoresist in which the portion exposed to light is removed by development, or a negative photoresist in which the portion not exposed to light is removed. For most negative photoresists, the polymer is the polyisoprene type, and the basic positive photoresist polymer is the phenol-formaldehyde type polymer. Both types of photoresists contain unsaturated bonds in their structures. For the purpose of an illustration, a negative photoresist is formed in this preferred embodiment of the present invention. After the deposition of the photoresist layer 204, a softbake process 206 is conducted to partially evaporate solvents in the photoresist layer 204, which can interfere with the rest of the processing.

Figure 2B:
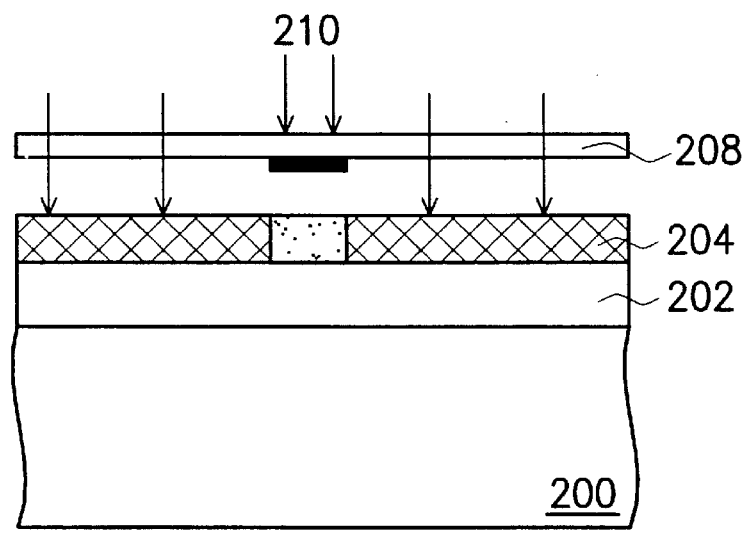

Continuing to FIG. 2B, a mask layer 208 with the desired pattern is accurately aligned and disposed over the photoresist layer 204. An exposure process is then conducted to encode the pattern onto the photoresist layer 204. In the case with a negative photoresist, the region of the photoresist layer 204 that is exposed to the light source, as illustrate by the crossed region of the photoresist layer 204 in the Figure, was changed from an unpolymerized condition to a polymerized one.

Figure 2C:
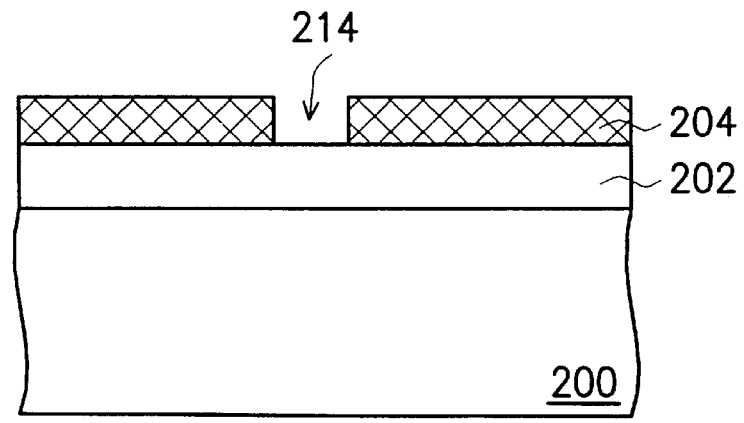

As shown in FIG. 2C, removing the unpolymerized portion of the photoresist layer 204 with chemical solvents or developers leaves an opening 214 in the photoresist layer 204 which corresponds to the opaque pattern on the mask layer 208 (as is shown in FIG. 2B). Following the development of the pattern coded on the photoresist layer 204, a hard bake process is conducted to additionally evaporate the solvents.

Figure 2D:
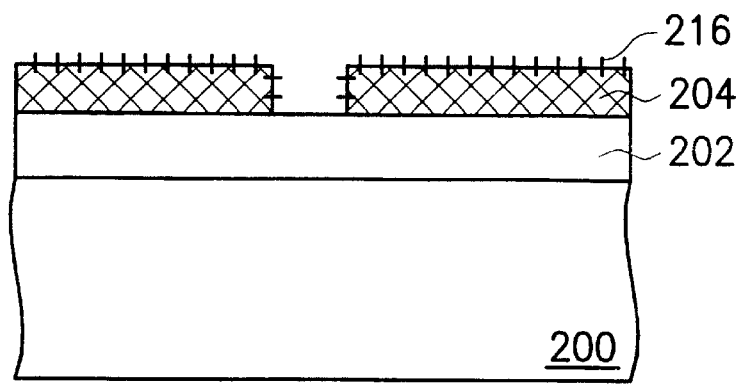

Referring to FIG. 2D, a surface treatment process, for example, a plasma treatment using a surface activating gas source (R), is conducted on the photoresist layer 204 to form free radicals and bridging bonds on the surface of the photoresist layer 204. The surface activating gas source includes fluorine gas ($F_2$), chlorine gas ($Cl_2$), bromine gas ($Br_2$), hydrogen fluoride (HF) gas, hydrogen chloride (HCl) gas, hydrogen bromide (HBr) gas, oxygen ($O_2$) gas, argon (Ar) gas, carbon monoxide (CO) gas, carbon dioxide ($CO_2$) gas, nitrogen ($N_2$) gas, ammonia ($NH_3$) gas, trifluoromethane gas ($CHF_3$) or carbon tetrafluoride ($CF_4$) gas. After the plasma treatment, many free radicals (•) and bridging bonds, for example, PR—R bond, PR•, PR—R•, R•, are formed on the surface of the photoresist layer 204. These free radicals and the bridging bonds are denoted by the reference number 216.

Figure 2E:
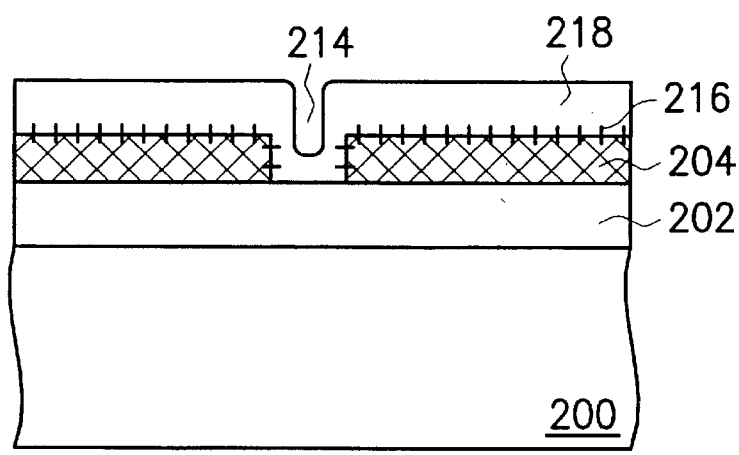

Continuing to FIG. 2E, a layer of photoresist 218 is conformally coated on the active surface of the photoresist layer 204 and in the opening 214. The free radicals and the bridging bonds 216 on the surface of the photoresist layer 204 is covalently reacted with the unsaturated bonds or functional group of the photoresist layer 218. The photoresist layer 218 is preferably the same type of the photoresist as the underlying photoresist layer 204 to prevent aggregation.

Figure 2F:
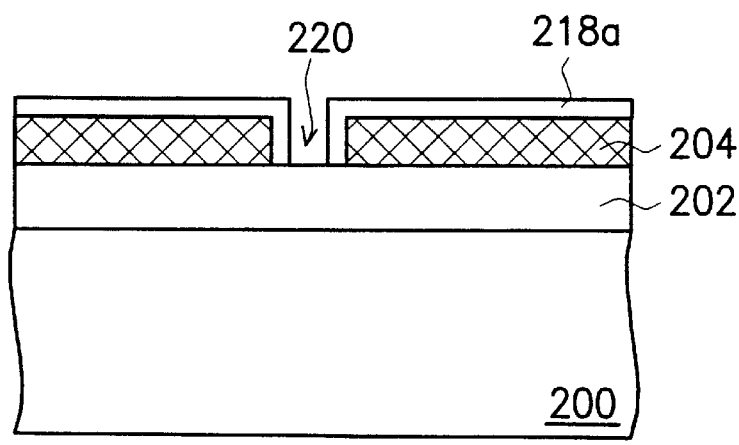

Referring to FIG. 2F, a thermal treatment is then conducted to accelerate the free radical chain reaction between the photoresist layer 204 and the photoresist layer 218 (as shown in FIG. 2E). For a negative photoresist, as in the preferred embodiment, the photoresist layer 218 can be developed directly without exposure. In the case with a positive photoresist, the photoresist pattern is developed after an exposure process. The portion of the conformal photoresist layer 218 not covalently bonded is removed in the development process, leaving only a thin conformal photoresist layer 218a on the photoreist layer 204. An ultra-small opening 220 is therebyformed in the photoresist layer 204. The duration of the thermal treatment determines the extent of the reaction between the photoresist layer 204 and the photoresist layer 218, and thus also determines the thickness of the photoresist layer 218a. As a result, the size of the ultra-small opening 220 can be controlled by the thickness of the photoresist layer 218a.

Subsequently (not shown in Figure), the material layer 202 is removed by etching through the opening 220 to forma an opening, such as a via or a contact opening in the material layer 202. The photoresist layers 204 and 218a are further stripped to finish the pattern formation process.

According to the preferred embodiment, the present invention is capable of creating very small openings or holes (e.g. sub-0.1 micron). The ultra-small opening of the present invention is formed by surface treating the photoresist layer 204 to form a double-coated photoresist layer 204. The critical dimension of a small opening is thereby effectively reduced without the loss of resolution by using the cheaper photolithography techniques. Since the duration of the thermal treatment process determines the thickness of the thin conformal layer 218a, the size of the opening 220 is easily controllable. This method of the present invention can thus provide an improvement in both the integration and the miniaturization of semiconductor devices to meet the industry demand in a cost-effective manner by scaling the existing technology in a controllable fashion.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for an ultra-small opening, wherein a substrate is provided, the method comprising:

forming a material layer on the substrate;

forming a first photoresist layer on the material layer;

disposing a mask layer with a pattern of a small opening over the first photoresist layer;

exposing the first photoresist layer;

developing the first photoresist layer to remove an unpolymerized portion of the first photoresist layer, wherein a first opening is formed in the first photoresist layer;

conducting a plasma treatment process to form free radicals and bridging bonds on a surface of the first photoresist layer;

coating a conformal second photoresist layer on the first photoresist layer and in the first opening, wherein a portion of the conformal second photoresist is covalently bonded with the first photoresist layer;

conducting a thermal treatment process, wherein a duration of the thermal process determines a thickness of a bonded portion of the conformal second photoresist layer to the first photoresist layer;

developing the conformal second photoresist layer to remove an unbonded portion of the conformal second photoresist layer and to form a second opening within the first opening of the first photoresist layer, the second opening being smaller than the first opening;

etching an exposed portion of the material layer through the second opening to form a third opening in the material layer; and stripping the first and the second photoresist layers.

2. The method according to claim 1, wherein the conformal second photoresist layer is formed with a same type of photoresist as the first photoresist layer.

3. The method according to claim 1, wherein the free radicals on the surface of the first photoresist layer reacts with the second photoresist layer when the conformal second photoresist layer is coated on the first photoresist layer and in the first opening, and the free radicals on the surface of the first photoresist layer reacts with the second photoresist layer.

4. The method according to claim 1, wherein the thermal treatment process accelerates the bonding between the conformal second photoresist layer and the first photoresist layer.

5. The method according to claim 1, wherein a duration of the thermal process determines a thickness of a bonded portion of the conformal second photoresist layer to the first photoresist layer.

6. The method according to claim 1, wherein the first photoresist layer includes a negative photoresist layer.

7. The method according to claim 1, wherein the first photoresist layer includes a positive photoresist layer.

8. The method according to claim 1, wherein before developing the conformal second photoresist layer, a step of exposure is conducted when the second photoresist layer is a positive photoresist.

9. The method according to claim 1, wherein a size of the second opening is smaller than that of the first opening.

10. The method of claim 1, wherein the size of the second opening is inversely related to a thickness of the second photoresist layer.

11. The method according to claim 1, wherein a size of the third opening in the material layer is less than 0.1 micron.

12. The method according to claim 1, wherein the plasma treatment process is conducted using a surface activating gas source.

13. The method according to claim 12, wherein the surface activating gas source is selected from the group consisting of hydrogen fluoride gas, hydrogen chloride gas, hydrogen bromide gas, oxygen gas, argon gas, carbon monoxide gas, carbon dioxide gas, nitrogen gas, ammonia gas, trifluoromethane gas, carbon tetrafluoride gas, chlorine gas, fluorine gas and bromine gas.

14. A method for reducing the critical dimension of a small opening, wherein a substrate is provided, the method comprising:

forming a first photoresist layer on a surface of the substrate, wherein the first photoresist layer is either a positive or a negative photoresist;

disposing a mask layer with a pattern of a small opening over the first photoresist layer; exposing the first photoresist layer;

developing the first photoresist layer to form a first opening in the first photoresist layer;

conducting a surface treatment process on a surface of the first photoresist layer to form free radicals and bridging bonds on the surface of the first photoresist layer;

forming a conformal second photoresist layer on the first photoresist layer and in the first opening, wherein the free radicals and bridging bonds on the surface of the first photoresist layer covalently react and bond with a portion of the second photoresist layer; and developing the second photoresist layer to remove an unbonded portion of the second photoresist layer to form a second opening in the first opening of the first photoresist layer, the second opening being smaller than the first opening.

15. The method according to claim 14, wherein the second photoresist layer is a same type of photoresist as the first photoresist layer.

16. The method according to claim 14, wherein the free radicals on the first photoresist layer react with the second photoresist layer when the second photoresist layer is formed on the first photoresist layer and in the first opening.

17. The method according to claim 14, wherein the first photoresist layer includes a negative photoresist layer.

18. The method according to claim 14, wherein the first photoresist layer includes a positive photoresist layer.

19. The method according to claim 14, wherein before developing the second photoresist layer, a step of exposure is conducted when the second photoresist layer is a positive photoresist.

20. The method according to claim 14, wherein a size of the second opening is smaller than the first opening.

21. The method according to claim 14, wherein a size of the second opening is less than 0.1 micron.

22. The method of claim 14, wherein the size of the second opening is inversely related to a thickness of the second photoresist layer.

23. The method according to claim 14, wherein a thermal treatment process is further conducted to accelerate the bonding between the second photoresis and the first photoresist layer after forming the second photoresist layer on the first photoresist layer and in the opening.

24. The method according to claim 23, wherein a duration of the thermal treatment process determines a thickness of a bonded portion of the second photoresist layer to the first photoresist layer.

25. The method according to claim 14, wherein the surface treatment process is conducted by performing a plasma treatment.

26. The method according to claim 25, wherein the plasma treatment is conducted with a surface activating gas source.

27. The method according to claim 25, wherein the surface activating gas source is selected from the group consisting of hydrogen fluoride gas, hydrogen chloride gas, hydrogen bromide gas, oxygen gas, argon gas, carbon monoxide gas, carbon dioxide gas, nitrogen gas, ammonia gas, trifluoromethane gas, carbon tetrafluoride gas, chlorine gas, fluorine gas and bromine gas.

* * * * *